United States Patent [19]

Mueller

[11] Patent Number: 5,733,803
[45] Date of Patent: Mar. 31, 1998

[54] METHOD FOR PRODUCING A MULTIPLICITY OF MICROELECTRONIC CIRCUITS ON SOI

[75] Inventor: Karlheinz Mueller, Waldkraiburg, Germany

[73] Assignee: Siemens Aktiengesellschaft, Muhich, Germany

[21] Appl. No.: 723,811

[22] Filed: Sep. 30, 1996

[30] Foreign Application Priority Data

Sep. 28, 1995 [DE] Germany .................. 195 36 249.7

[51] Int. Cl.[6] .................................................... H01L 21/84
[52] U.S. Cl. ........................ 438/154; 438/155; 438/157; 438/311
[58] Field of Search ................................ 438/155, 157, 438/154, 300, 311, 368

[56] References Cited

U.S. PATENT DOCUMENTS

| | | | |
|---|---|---|---|
| 4,276,688 | 7/1981 | Hsu | 438/154 |
| 5,164,326 | 11/1992 | Foerstner | 438/154 |
| 5,389,561 | 2/1995 | Gomi | 437/31 |
| 5,545,579 | 8/1996 | Liang | 438/291 |

*Primary Examiner*—John Niebling
*Assistant Examiner*—Brendan Mee
*Attorney, Agent, or Firm*—Herbert L. Lerner; Laurence A. Greenberg

[57] ABSTRACT

A method for producing a multiplicity of microelectronic circuits on SOI uses a standardized process to produce n-CMOS or p-CMOS transistors, NPN-transistors or PNP-transistors, for instance. All that is required to do so is to adapt the implantations that are performed.

12 Claims, 4 Drawing Sheets

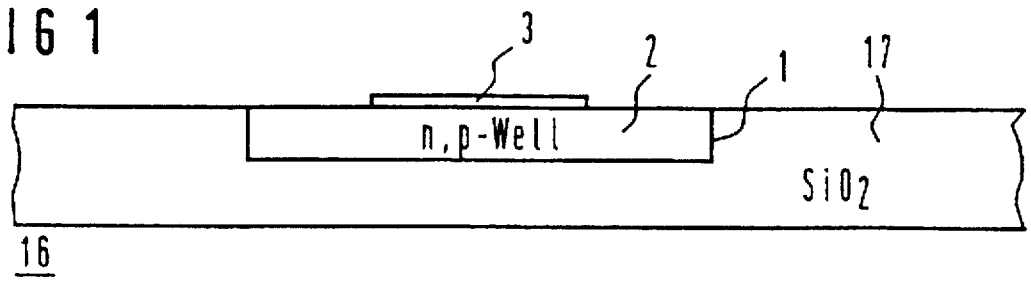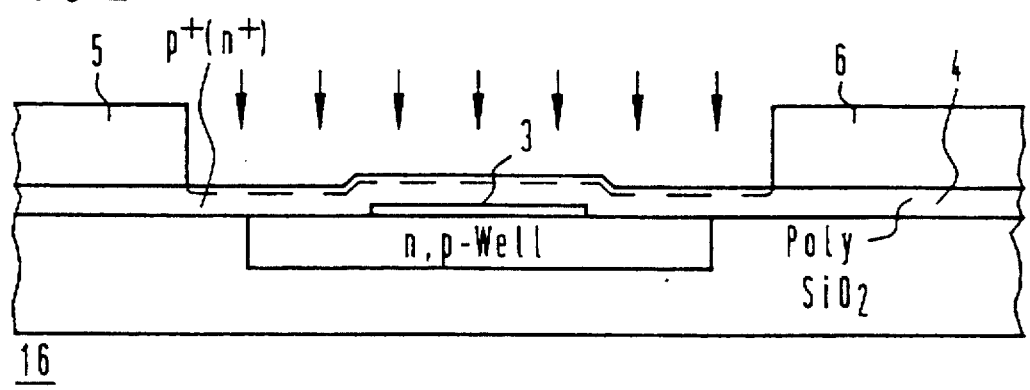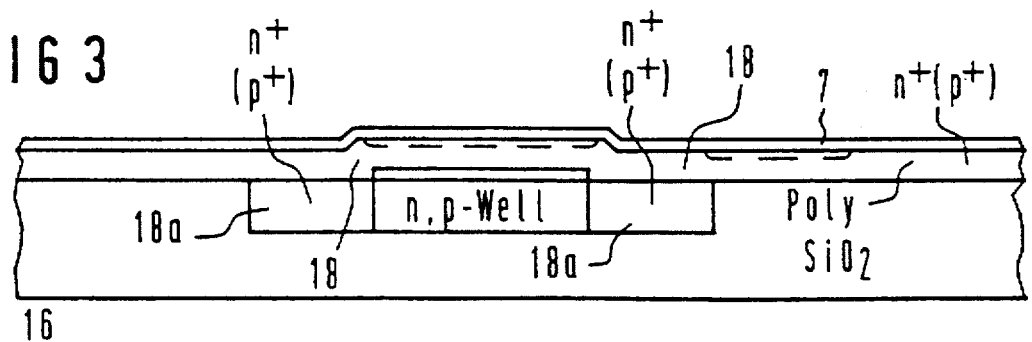

METHOD FOR PRODUCING A MULTIPLICITY OF MICROELECTRONIC CIRCUITS ON SOI

BACKGROUND OF THE INVENTION

Field of the Invention

The invention relates to a method for producing a multiplicity of microelectronic circuits on SOI. In particular, CMOS transistors and/or bipolar transistors are produced.

A number of different methods are known with which microelectronic circuits as well as CMOS circuits or bipolar transistors can be produced. However, the methods differ considerably from one another and cannot be combined with one another, or can only be so combined with major effort.

SUMMARY OF THE INVENTION

It is accordingly an object of the invention to provide a method for producing a multiplicity of different microelectronic structures on SOI, and especially CMOS structures and bipolar transistors, which overcomes the hereinaforementioned disadvantages of the heretofore-known methods of this general type.

With the foregoing and other objects in view there is provided, in accordance with the invention, a method for producing a multiplicity of microelectronic circuits on SOI, in particular CMOS transistors and/or bipolar transistors, which comprises defining a multiplicity of active regions in an insulator material; implanting an n-well or a p-well in each of the active regions, depending on the structure to be created; creating and structuring a gate oxide on the active regions; applying a first polysilicon layer; performing an $n^+$ or $p^+$ implantation depending on the structure to be created, and doping two underlying regions of the well with a later temperature treatment; applying an oxide layer; etching the oxide layer and the silicon layer under it to define other active regions; applying an oxide layer and etching spacers out of the oxide layer at the etched polysilicon structures of the other active regions; applying a second polysilicon layer; performing a $p^-$ or $n^-$ implantation, depending on the structure to be created; structuring the second polysilicon layer to create edges and providing the second polysilicon layer with an oxide coating; etching spacers on the edges; diffusing implanted dopants out of the polysilicon into the well region lying under it, with a temperature treatment; siliciding the bared oxide layer by the introduction of a suitable metal; and creating metal contacts.

Through the use of the method of the invention, it is possible to define a multiplicity of active regions on one wafer, and using the same process block to produce a multiplicity of different structures, where only the dopings have to be adapted.

In accordance with another feature of the invention, in order to produce an n-CMOS structure, a p-well is first implanted, and by implantation in the overlying polysilicon layer and ensuing curing, an $n^+$ source/drain and gate implantation, and in a concluding implantation step an $n^-$ LDD implantation on both sides, are carried out.

In accordance with a further feature of the invention, in the production of a p-CMOS structure, an n-well is first implanted, and then by implantation in the first polysilicon layer and curing, a $p^+$ source/drain and gate implantation and in conclusion a $p^-$ LDD implantation on both sides is carried out.

In accordance with an added feature of the invention, an NPN-transistor is produced by first implanting an n-well, and then performing an $n^+$ implantation to produce emitter and collector regions, in the first polysilicon layer, in combination with a curing process for diffusion of the dopant atoms from the polysilicon layer into the well regions located under them, and later a $p^-$ implantation on one side is performed to create a base.

In accordance with an additional feature of the invention, in order to produce a PNP-transistor, a p-well is first created, emitter and collector regions are created with ensuing $p^+$ doping, and a base is produced with later $n^-$ implantation.

In accordance with yet another feature of the invention, a multiplicity of identical structures are created on one wafer. In this way, a multiplicity of electronic components can be created in one process sequence. It is equally possible, of course, to produce different structures on one wafer. To that end, various implantations must be performed within the process standardized according to the invention.

In transistor production, two-sided spacer formation is an especially advantageous embodiment since through the use of this process, the base widths of the transistors can be set to be especially slight.

Through the use of the method of the invention, a high-performance BiCMOS process on SOI is accomplished, in which two polysilicon layers are used for the CMOS structures and lateral bipolar transistors. Lateral steep dopant profiles are also obtained through the diffusion of the dopant from polysilicon to monosilicon. The process according to the invention can be performed with and without contact holes. If a contact hole is formed, the contacts are guided on the polysilicon, while in standard processes they are guided on the monosilicon. However, then the problem exists of etched-on features being formed in the region of the monosilicon. Due to the thin silicon layers used in SOI processes, such etching on can be critical. Accordingly in this method, the possible contacting through contact holes, with the contacts guided to the polysilicon, is advantageous.

In order to dope the individual well regions, dopants are implanted in the overlying polysilicon layers, and in an ensuing curing process these dopants are diffused out of the polysilicon into the underlying regions of the well. Such a curing step can be performed after each individual implantation. Preferably, however, only a single joint curing process is performed after the final implantation.

Other features which are considered as characteristic for the invention are set forth in the appended claims.

Although the invention is illustrated and described herein as embodied in a method for producing a multiplicity of microelectronic circuits on SOI, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 1–6 are fragmentary, diagrammatic, cross-sectional views showing various stages of the method during the course of the process;

DESCRIPTION OF THE PREFERRED EMBODIMENTS

Figure 4:
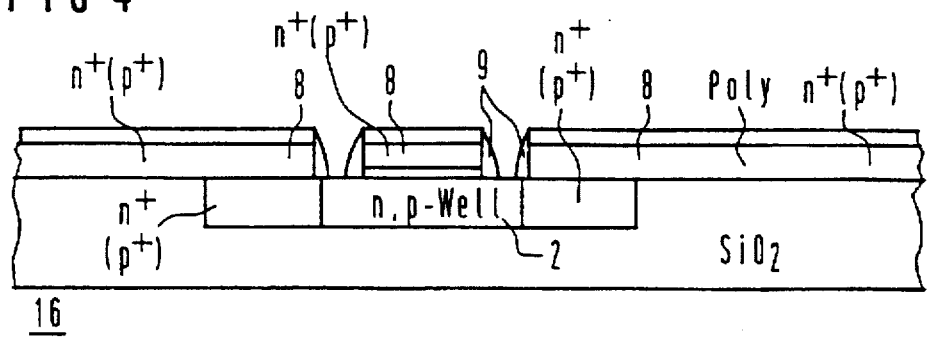

Referring now to the figures of the drawings in detail and first, particularly, to FIG. 1 thereof, it is seen that at the beginning of the method, a silicon dioxide layer 17 and a silicon layer over it are applied 16 a substrate 16. Active regions 1 are defined by mesa etching or oxidation in the silicon layer. A thus-created active region 1 is shown in FIG. 1. On the wafer which is used, a multiplicity of active regions 1 are defined, in each of which one structure is created. For the sake of simpler illustration, the drawings each show only one active region 1. With a mask technique, the regions outside the active regions are covered, and in the active regions 1 an n-tub 2 or p-tub 2 is created by an $I^2$ implantation. These tubs are also known as wells and are formed of monosilicon. The selection of the dopant atoms depends on the structure to be created. In order to provide an n-CMOS or a PNP-transistor, a p-well is created, while in order to provide a p-CMOS or an NPN-transistor, an n-well is created. The thus-implanted well is cured by temperature treatment. Next, a gate oxide 3 is applied, structured with a further mask technique, and $SiO_2$ etched, so that the gate oxide 3 covers only a portion of the active regions 1.

In the next steps, shown in FIG. 2, a first polysilicon layer 4 is applied over the entire surface. In this polysilicon layer 4, high-impedance resistors can be created by $n^-$ or $p^-$ implantations. They serve to join and further connect the structures which are created. A resist mask having regions 5 and 6 is also applied, and with it an $n^+$ or a $p^+$ implantation is performed. In the production of CMOS structures, these implantations serve the purpose of source/drain implantation and gate doping, and when transistors are produced, they serve to produce emitters and collectors. Moreover, a base terminal for the PNP-transistor, or capacitors and resistors, can be created with the $n^+$ implantation. Conversely, with the $n^-$ implantation, a base terminal for the NPN-transistor or capacitors and resistors can be created.

In this way, $n^+$ or $p^+$ doped regions 18 are created in the polysilicon layer 4. A first curing step can then take place, in which the dopant atoms also diffuse into underlying regions 18a of the well 2. The gate 3 acts as a diffusion brake, so that in this middle region no further doping of the well 2 takes place. An oxide layer 7 is also applied over the first polysilicon layer 4 and it extends over the entire wafer precisely like the underlying first polysilicon layer. It is not until the following steps that the layers, which are initially applied over the entire surface, are structured for use inside the respective active regions 1. This stage of the method is shown in FIG. 3.

Figure 5:
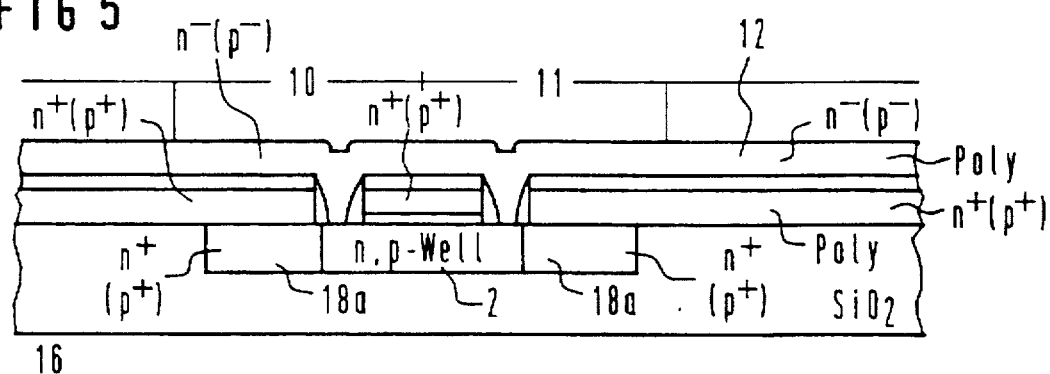

FIG. 4 thus shows the way in which other active regions 8 are created with a further mask technique. The oxide layer 7, the first polysilicon layer 4, and the underlying gate oxide 3 are etched down to the well 2 beneath them. An oxide layer is applied onto the thus-created structure, and spacers 9 are etched on edges of this structure with a spacer technique. A second polysilicon layer 12 which is applied also fills the previously created interstices, applies itself to the spacers 9 and extends downward as far as the well 2. A resist mask 10, 11 is applied over this second polysilicon layer 12, as is shown in FIG. 5, and with the aid thereof, a $p^-$ or $I^2$ implantation is carried out. With the $p^-I^2$ implantation, the base can be created in an NPN-transistor, or an LDD implantation can be carried out in the p-CMOS transistor. Analogously, with the $n^-I^2$ implantation, the base of the PNP-transistor would be created, or in an n-CMOS transistor an LDD implantation would be performed.

Figure 6:
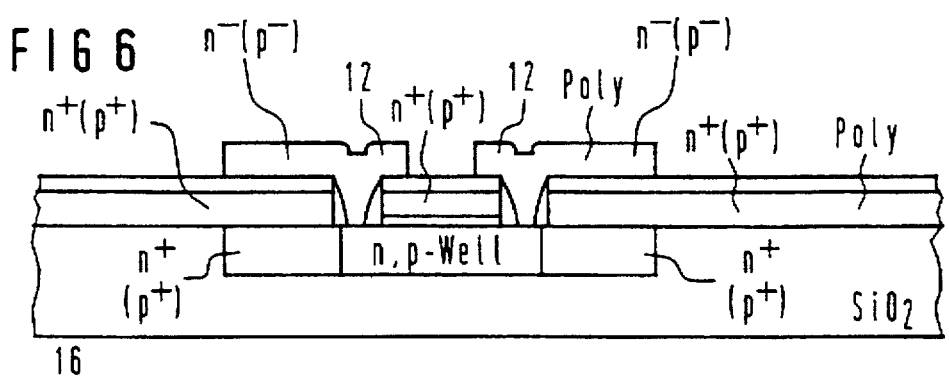

The second polysilicon layer 12 is etched and thereby structured with a further mask technique. The structures thus created are shown in FIG. 6. The dopants are diffused out of the polysilicon layer 12 into the underlying monosilicon regions of the well 2 with a further temperature treatment. These regions are located between the previously created outer $n^+$ or $p^+$ doped regions 18a and a central region 19 of the well. It is also possible to carry out this curing process as the only curing process, omitting previous curing processes. In that case, the dopants would simultaneously diffuse out of the regions 18 of the first polysilicon layer 4 into the underlying outer regions 18a of the well 2 and the dopants would diffuse out of the second polysilicon layer 12 into the just-described regions of the well 2. Additionally, an oxide coating is made, and as can be seen, for instance, in FIG. 7, spacers 13 are etched at edges of the structures created in the second polysilicon layer 12. A suitable metal is applied, creating a silicide 14, in the regions of the bared oxide layer 7 and the second silicon layer 12 that was previously coated with oxide. The process used in this case is a silicide process. Metal contacts 15 are also applied for contacting purposes.

Figure 7:
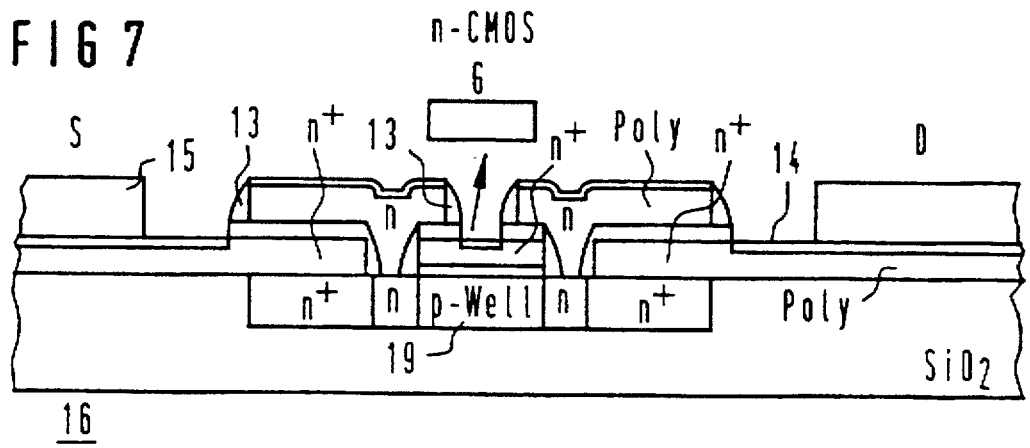
FIG. 7 is a fragmentary, cross-sectional view of an n-CMOS transistor produced by the method of the invention.
Figure 8:
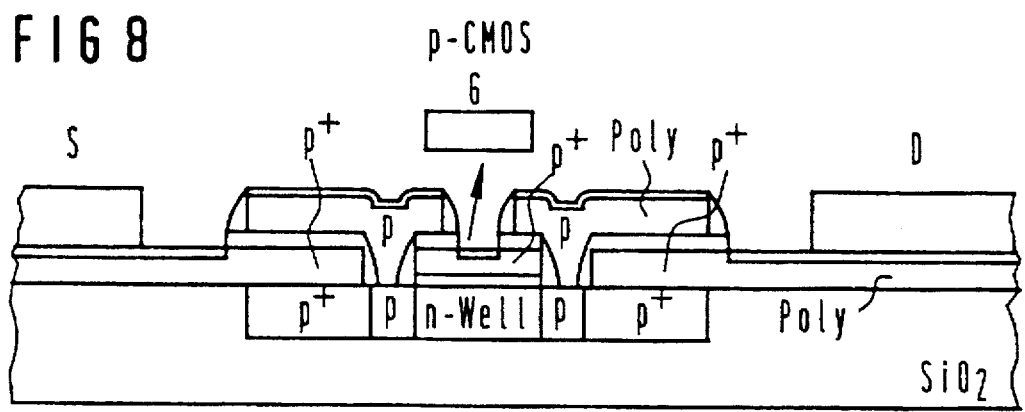
FIG. 8 is a fragmentary, cross-sectional view of a p-CMOS transistor produced by the method of the invention.
Figure 9:
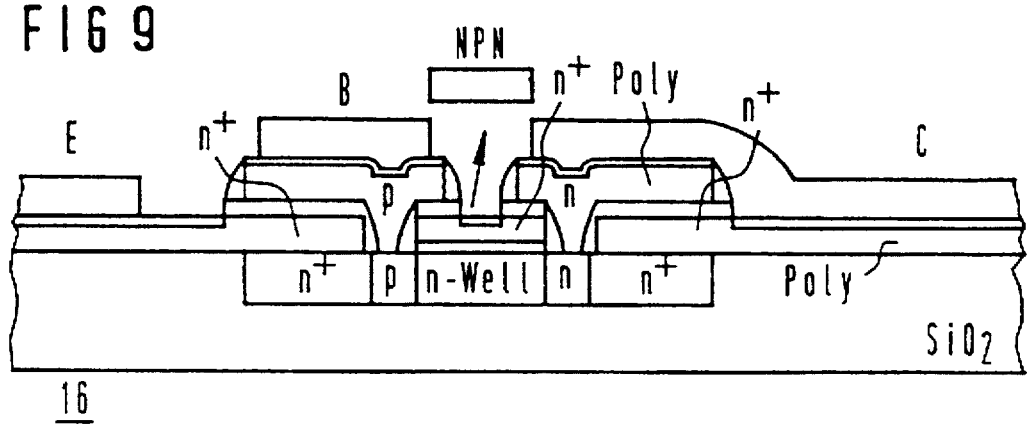
FIG. 9 is a fragmentary, cross-sectional view of an NPN-transistor produced by the method of the invention.
Figure 10:
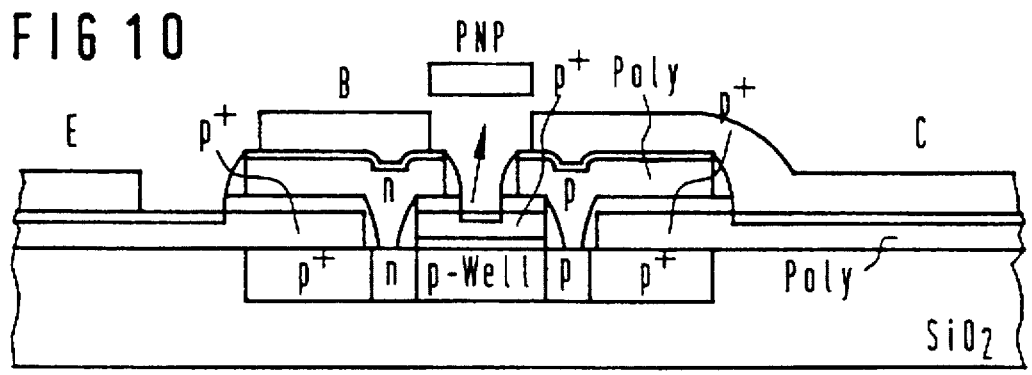
FIG. 10 is a fragmentary, cross-sectional view of a PNP-transistor produced by the method of the invention.

Structures that can be produced by this method are shown in FIGS. 7–10. FIG. 7 shows an n-CMOS transistor, FIG. 8 a p-CMOS transistor, FIG. 9 an NPN-transistor and FIG. 10 a PNP-transistor. Reference symbol S stands for source, D for drain and G for gate. The letters E, B and C in the case of the transistors stand for emitter, base and collector. Above the central region of the well 19, an arrow indicates that a metal contact 15 is likewise provided there.

I claim:

1. A method for producing a multiplicity of microelectronic circuits on a silicon on insulator substrate, which comprises:

defining a multiplicity of active regions in a silicon on insulator substrate;

implanting an n-well or a p-well in each of the active regions;

creating and structuring a gate oxide on the active regions;

applying a first polysilicon layer;

performing an $n^+$ or $p^+$ implantation and diffusing implanted dopants into two underlying regions of the well;

applying an oxide layer;

etching the oxide layer and the polysilicon layer under it to expose portions of the active regions;

applying a second oxide layer and etching spacers out of the second oxide layer at sides of the etched first polysilicon layer which lie on top of the active regions;

applying a second polysilicon layer;

performing a $p^-$ or $n^-$ implantation;

structuring the second polysilicon layer to create edges and providing the second polysilicon layer with an oxide coating;

etching spacers on the edges;

diffusing implanted dopants out of the second polysilicon into the well region lying under it, with a temperature treatment;

introducing a metal to form a silicide; and creating metal contacts.

2. The method according to claim 1, which comprises producing an n-CMOS structure by first implanting a p-well, $n^+$doping the outer regions of the well by doping the polysilicon layer and curing, and then performing an $n^-$doping on both sides of the etched first polysilicon layer.

3. The method according to claim 1, which comprises producing p-CMOS structure by first implanting an n-well, $p^+$doping the first polysilicon layer, and then $p^-$doping the second polysilicon layer on both sides of the etched first polysilicon layer.

4. The method according to claim 1, which comprises producing an NPN-transistor by first implanting an n-well, $n^+$doping the first polysilicon layer, and then performing a $p^-$doping on one side of the etched first polysilicon layer to create a base.

5. The method according to claim 1, which comprises producing a PNP-transistor by first implanting a p-well, $p^+$-doping the regions of the first polysilicon layer, and then performing an $n^-$doping on one side of the etched first polysilicon layer to create a base.

6. The method according to claim 1, which comprises creating a multiplicity of identical structures.

7. The method according to claim 1, which comprises adjusting a base width with two-sided spacers, during a transistor production.

8. The method according to claim 1, which comprises contacting the polysilicon with contact holes.

9. The method according to claim 1, which comprises doping the well regions with a single doping process after a final implantation step.

10. The method according to claim 1, which comprises producing CMOS transistors and bipolar transistors in the insulator material.

11. The method according to claim 1, which comprises producing CMOS transistors in the insulator material.

12. The method according to claim 1, which comprises producing bipolar transistors in the insulator material.

\* \* \* \* \*